(12) United States Patent
Shiraki

(10) Patent No.: US 7,656,334 B2
(45) Date of Patent: Feb. 2, 2010

(54) SIGNAL PROCESSOR

(75) Inventor: Toru Shiraki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 748 days.

(21) Appl. No.: 10/561,267

(22) PCT Filed: May 19, 2004

(86) PCT No.: PCT/JP2004/007109

§ 371 (c)(1),
(2), (4) Date: Dec. 19, 2005

(87) PCT Pub. No.: WO2005/112267

PCT Pub. Date: Nov. 24, 2005

(65) Prior Publication Data

US 2007/0096968 A1    May 3, 2007

(51) Int. Cl.
*H03M 1/12* (2006.01)
(52) U.S. Cl. .................. 341/155; 341/141
(58) Field of Classification Search ............... 341/155, 341/141, 118; 327/536, 589
See application file for complete search history.

(56) References Cited

U.S. PATENT DOCUMENTS

| | | | | |
|---|---|---|---|---|
| 4,839,650 A | * | 6/1989 | Geen et al. | 341/118 |
| 6,804,187 B2 | * | 10/2004 | Miyanabe et al. | 369/124.03 |
| 6,943,714 B2 | * | 9/2005 | White | 341/141 |
| 2001/0005384 A1 | * | 6/2001 | Kessler | 370/535 |

FOREIGN PATENT DOCUMENTS

| | | |
|---|---|---|
| JP | 59-194563 | 11/1984 |
| JP | 7-312551 | 11/1995 |
| JP | 2001-111424 | 4/2001 |

* cited by examiner

*Primary Examiner*—Brian Young
(74) *Attorney, Agent, or Firm*—Oblon, Spivak, McClelland, Maier & Neustadt, L.L.P.

(57) ABSTRACT

A signal-processing unit according to the present invention comprises: an input line provided with a plurality of analog input signal lines; a multiplexer circuit transmitting the plurality of analog signals from this input line to one signal line in the subsequent stage in a desired sequence; an analog-digital conversion circuit that converts an analog signal into a digital signal and outputs it; and a cross talk compensation circuit that with respect to each of signals having been sequentially outputted from the analog-digital conversion circuit, a coefficient of an effect level between this signal and the other plural signals interfering with each other is calculated, and data obtained by multiplying the signals by these coefficients are added up.

6 Claims, 7 Drawing Sheets

SIGNAL PROCESSOR

TECHNICAL FIELD

The present invention relates to a signal-processing unit and, more particularly, to a signal-processing unit that is applied to, e.g., document reading devices and that converts a plurality of analog signals into digital signals to make a high-speed processing.

BACKGROUND ART

Recently, a document reading device for use in scanners, multifunction copying machines or the like, has become remarkably faster in reading speed per line. In a signal-processing unit to be applied to this document-reading device, it is necessary to divide one line into a plurality of blocks to make a parallel processing, as well as to process at higher speed each of the blocks having been divided. Moreover, a circuit for processing analog data read out individually in each of the plurality of blocks needs to operate at higher speed as a matter of course. On the other hand, conforming to document-reading devices being downsized, a signal-processing unit also tends to be downsized by, e.g., being formed into one chip.

Basically, each block in a signal-processing unit is connected through a switched capacitor of which ON/OFF is controlled at drive clock. Fetching data from each block, and transferring data to the subsequent block are processed by adjustment of a timing of drive clock so as to prevent interference between signals processed by each block.

In the conventional signal-processing unit, however, a problem exists in that a state in which outputs of adjacent signals are affected each other depending on timing of switching of each circuit block occurs when the signal-processing unit is driven at high speed by a high-speed clock, or that layout and wiring run of each circuit become hard as circuits are downsized, resulting in the interference of wiring with each other. Thus, the interference between signal data with each other, so-called cross talk, occurs between each of the circuits. Therefore, a further problem exists in that data after having been fetched in the signal-processing unit are changed or deteriorated as compared with data before being fetched in the signal-processing unit, and that correlation between data before signal processing and data after signal processing cannot be obtained. Furthermore, as document reading devices are downsized and operated at high speed, there arise situations in which wiring between plural lines of signals to be parallel-processed comes to be proximate, thus the cross talk between wirings may occur in early stage of the signal-processing unit.

As measures against these situations, to solve the problems as mentioned above, it has been attempted that the circuit layout in an internal part of a signal-processing unit, or switching timing between blocks are optimized; or wiring in the document reading device is designed to prevent the lines from being proximate to each other to a minimum. In actual, however, there remains the cross talk that is not eliminated even by those measures. For example, in the case of reading documents with the use of such a signal-processing unit for processing read data of the document reading device, the so-called "ghost phenomenon" in which a certain part of output data is seen in the other part like a thin shadow occurs, resulting in deterioration of picture quality.

The invention was made to solve the above-mentioned problems, and has an object of providing a signal-processing unit making it possible to effectively process the cross talk between signal data that occurs when a plurality of signal lines are processed in parallel.

DISCLOSURE OF INVENTION

A signal-processing unit according to the present invention comprises:

an input line that is provided with a plurality of analog input signal lines;

a multiplexer circuit that transmits a plurality of analog signals from the mentioned input line to one signal line in the subsequent stage in a desired sequence;

an analog-digital conversion circuit that converts an analog signal into a digital signal and outputs it; and a cross talk compensation circuit that with respect to each of a plurality of signals having been synchronously inputted to a signal-processing unit out of signals having been sequentially outputted from the mentioned analog-digital conversion circuit, a coefficient of an effect level between each of a plurality of signals and the other plural signals interfering with each other is calculated, and data obtained by multiplying the signals by these coefficients are added up.

Another signal-processing unit according to the invention comprises:

an input line provided with a plurality of analog input signal lines;

a multiplexer circuit that transmits a plurality of analog signals from the mentioned input line into one signal line in the subsequent stage in a desired sequence;

an analog-digital conversion circuit that converts an analog signal into a digital signal and outputs it; and a cross talk compensation circuit that with respect to one signal out of signals having been sequentially outputted from the mentioned analog-digital conversion circuit, a coefficient of an effect level between a plurality of signals before and after this signal and a plurality of signals interfering with each other is calculated, and data obtained by multiplying the signals by these coefficients are added up.

Further signal-processing unit according to the invention is provided with a communication processing circuit enabling to change cross talk elimination coefficients from outside of the device.

According to the invention, a signal-processing unit making it possible to suppress cross talk that occurs between wirings of signals of a document reading device, or cross talk that occurs in the analog signal processing section when a circuit for processing signals of the document reading device is constructed in one IC chip form such as ASIC to be downsized, can be provided easily as well as with high accuracy. In addition, a storage device for storing cross talk elimination coefficients has a communication function with outside of the device, whereby it comes to be possible to easily alter coefficients individually depending on a document reading device without necessity of adding or replacing any parts.

BEST MODE FOR CARRYING OUT THE INVENTION

Embodiment 1

Figure 1:
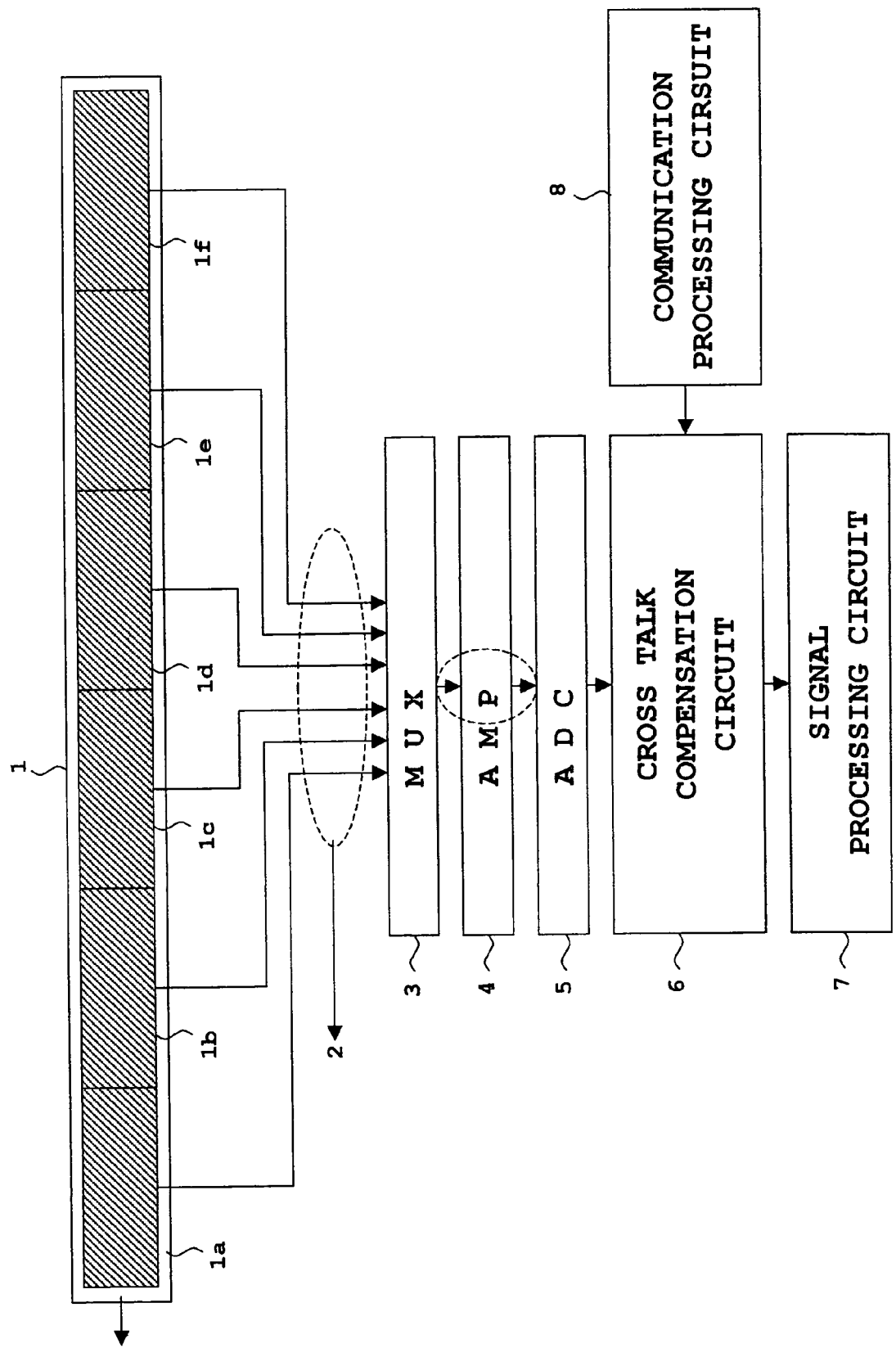
FIG. 1 is a schematic diagram of an entire signal-processing unit according to a first preferred embodiment.

Hereinafter, a first preferred embodiment according to the present invention is described referring to FIGS. 1 through 6. FIG. 1 is a schematic diagram of an entire signal-processing unit according to the first embodiment. In the drawing, reference numeral 1 designates a document-reading device (for example, a contact image sensor) for use in scanners, multi-function copying machines and the like, and shows a state in which one line is divided into a plurality of blocks (six blocks 1a to 1f in the drawing). Numeral 2 shows a section of fetching analog input signals to be read out from each block, and the cross talk between signals as described above takes place in this section. Numeral 3 designates a multiplexer circuit that transmits the above-mentioned plural analog input signals to one signal line in a desired sequence. Numeral 4 designates an amplifier circuit that amplifies the above-mentioned multiplexed signals. Numeral 5 designates an analog-digital conversion circuit that converts analog signals having been amplified into digital signals. Numeral 6 designates a cross talk compensation circuit, being a subject of the invention. Numeral 7 designates a normal signal processing circuit that processes digital output signals of which cross talk has been compensated. In addition, numeral 8 designates a communication processing circuit enabling to externally control coefficients for controlling the above-mentioned cross talk compensation circuit 6.

Figure 2:
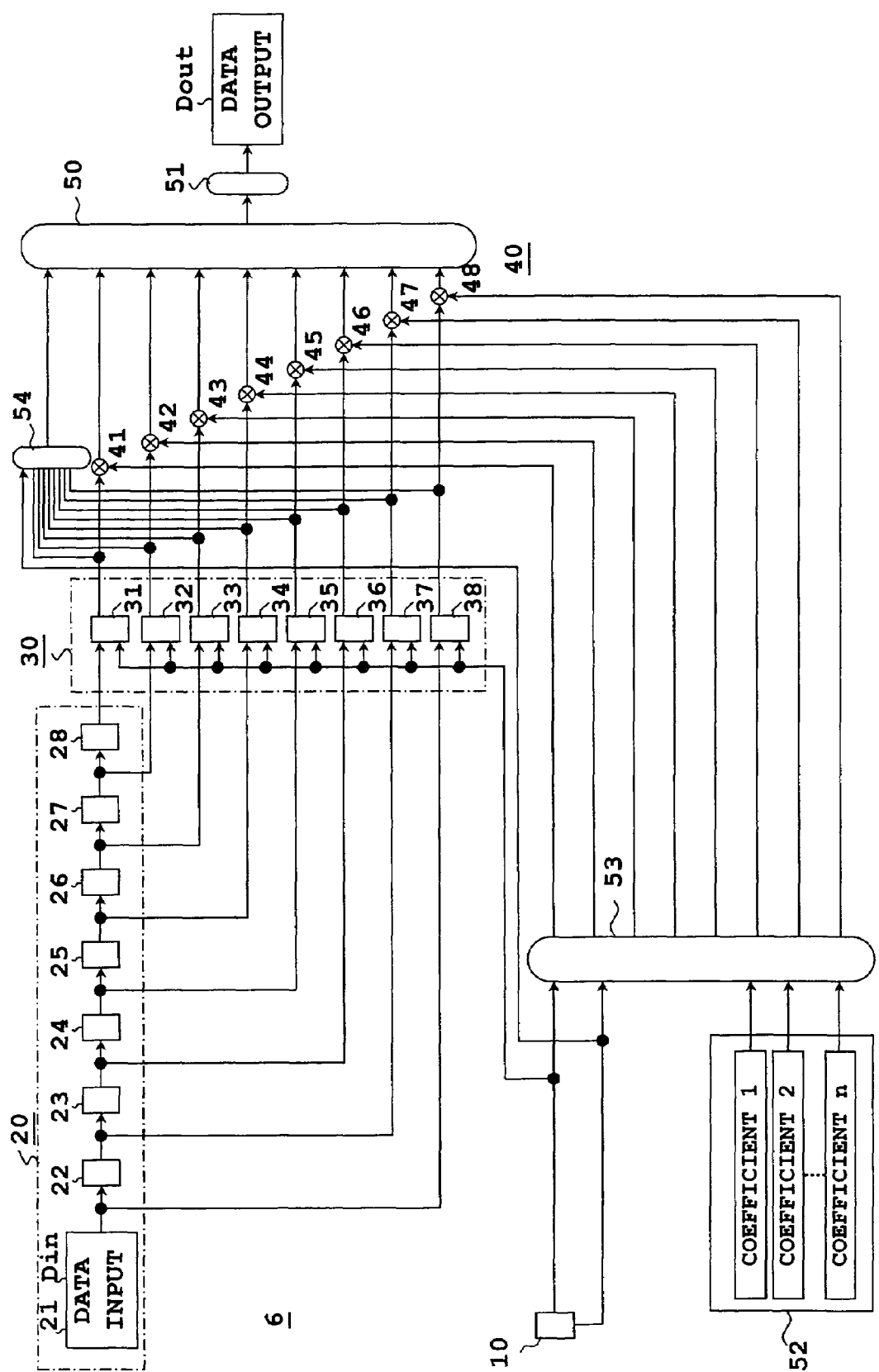
FIG. 2 is a circuit diagram showing a detailed arrangement of a cross talk compensation circuit of the signal-processing unit of FIG. 1.

FIG. 2 is a detailed circuit diagram of the above-mentioned cross talk compensation circuit 6. In the drawing, numeral 10 designates a counter that counts the number of parallel signals of the above-mentioned data input. Numeral 20 designates a shift register circuit that consists of plural storage blocks 21 to 27, and that sequentially transfers the above-mentioned data input $D_{in}$ to the subsequent stage on a stage-by-stage basis conforming to a clock period. The block 21 stores a digital data input signal $D_{in}$ to be input through the above-mentioned analog-digital conversion circuit 5 (FIG. 1). The block 22 stores a signal having been inputted to the foregoing cross talk compensation circuit 6 one clock before. The blocks 23-28 likewise store respective signals having been inputted to this cross talk compensation circuit 6, 2-7 clocks before respectively. Numeral 30 designates a signal hold circuit consisting of 8 channels 31 to 38 that holds data until all signals are stored in the above-mentioned storage blocks 21 to 28. Numeral 40 designates a multiplier that consists of eight channels 41 to 48, and that multiplies data held in the above-mentioned signal hold circuits 31 to 38 by data obtained by the calculation of coefficients of signal interference levels between signals as described below. Numeral 50 designates an adder that adds up respective signals of each of the channels of the above-mentioned multiplier 40 to prepare a compensation data. Numeral 51 designates a circuit that prevents the overflow or underflow of the above-mentioned data based on the number of bits of data output. $D_{out}$ shows a digital data output having been compensated. Numeral 52 designates a storage device that has preliminarily stored data obtained by the calculation of coefficients of signal interference levels between signals as described below. Numeral 53 designates a multiplexer circuit that makes the matching of data of the above-mentioned signal hold circuits 31 to 38 and coefficient data of the above-mentioned storage device 52. Numeral 54 is a selection circuit that selects signals of which cross talk has to be compensated. The counter 10 outputs an active signal 1, for example, when a count value comes to be x, and outputs 0 other than this time. Further, the counter 10 sends out a hold data of the signal hold circuit 30 every time an active signal 1 is outputted, and fetches the next value in the signal hold circuit 30 from the subsequent stage.

Figure 3:
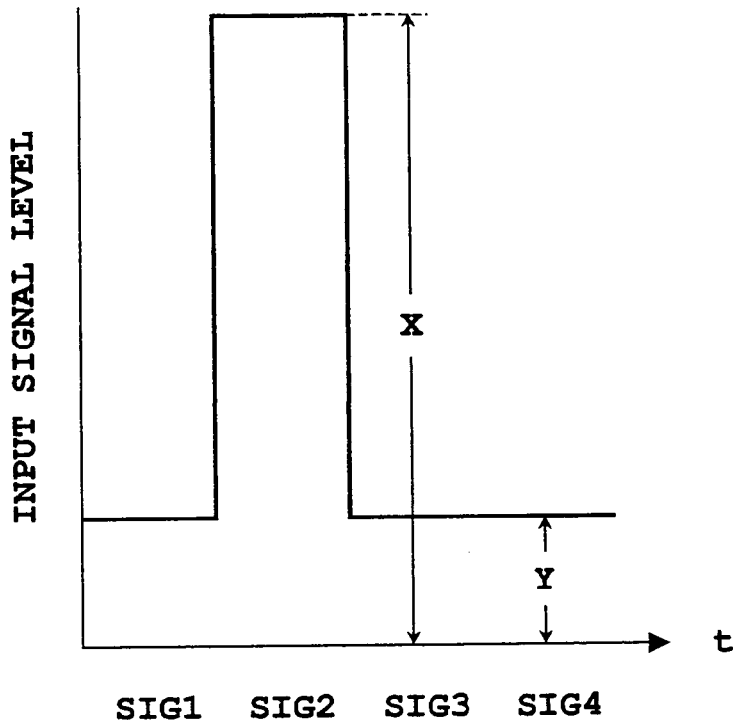
FIG. 3 is a waveform chart of an output signal (digital) in which cross talk of the signal-processing unit according to the first embodiment has been compensated.
Figure 4:
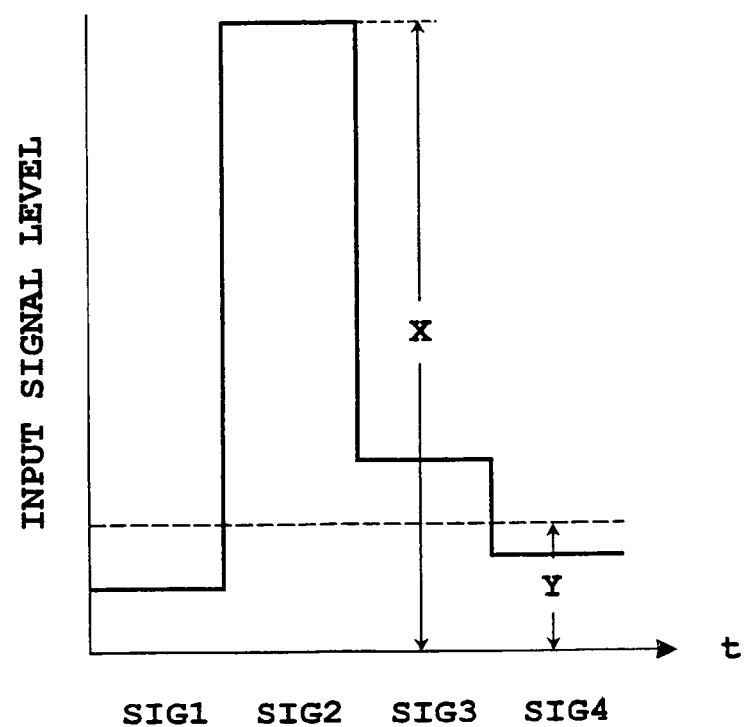
FIG. 4 is a waveform chart of an output signal (digital) in which cross talk of the signal-processing unit according to the first embodiment is not compensated.
Figure 5:
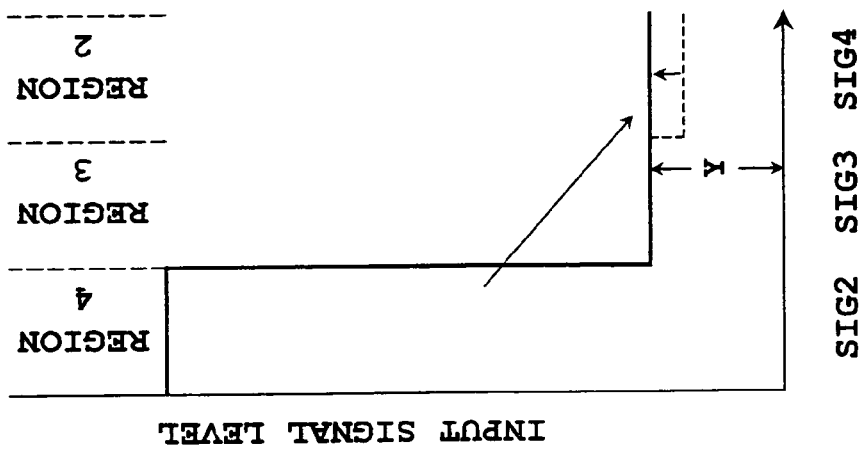
FIG. 5 are waveform charts of an output signal (digital) showing the process of compensating cross talk of the signal-processing unit according to the first embodiment.
Figure 5:
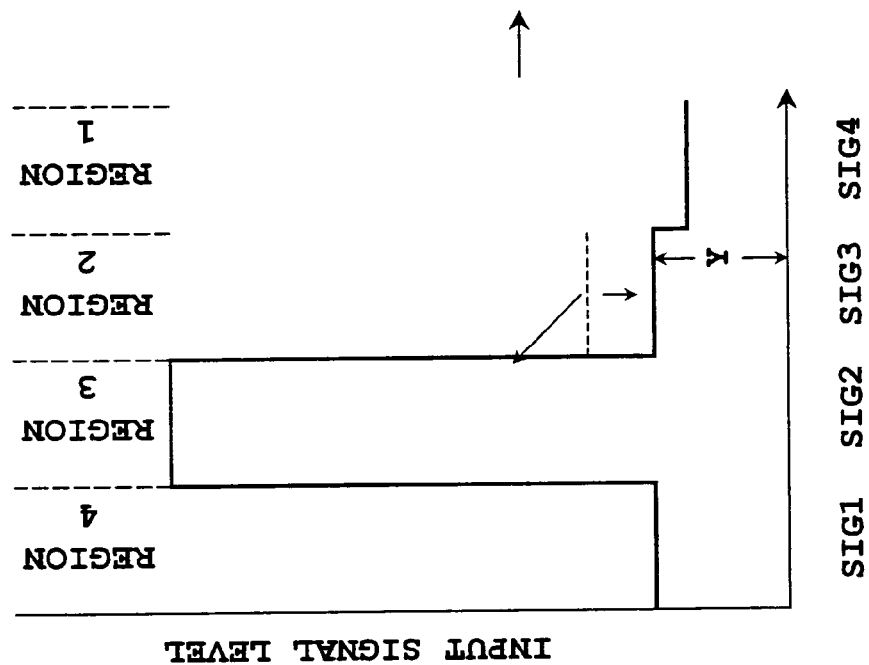
Figure 5:
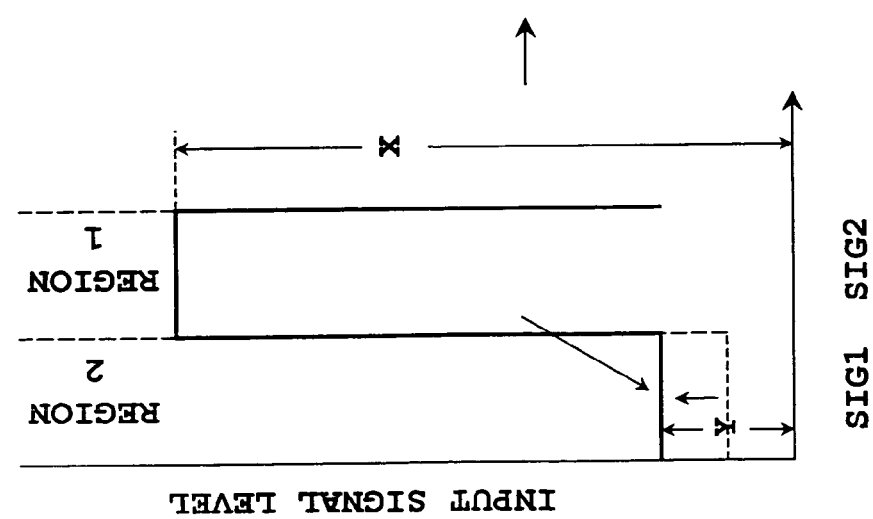

FIG. 3 is an output signal waveform chart in which cross talk of a signal-processing unit according to the first embodiment has been compensated. FIG. 4 is likewise an output signal waveform chart in which cross talk is not compensated. FIG. 5 are output signal waveform charts showing states in which the above-mentioned cross talk is compensated with the use of the cross talk compensation circuit 6 of FIG. 2. In the drawings, it is assumed that a plurality of analog input signals are a series of signals, and are transmitted in order of, for example, SIG1, SIG2, SIG3, SIG4; as well as a large input X (desired maximum value of digital data) is inputted to SIG2, and a small input Y is inputted to SIG1, 3, 4. Further, regions 1 to 4 correspond to respective blocks of the storage blocks 22 to 28 of FIG. 2, and out of these blocks, input signals in adjacent 2 to 4 blocks are shown. For example, the region 1 may be replaced with the block 25, the region 2 with the block 24, the region 3 with the block 23, and the region 4 with the block 22. Now, the procedure of compensating an output waveform as shown in FIG. 4 having been affected by cross talk is illustratively described with reference to FIG. 5. First, with reference to FIG. 5(a), when SIG2 is fetched into the region 1, a decreased amount of SIG1 in the region 2 is compensated upward (indicated by an arrow). Moreover, as in FIG. 5(b), when SIG2 is fetched into the region 3, a decreased amount of SIG3 in the region 2 is compensated downward (indicated by an arrow). Further, as shown in FIG. 5(c), when SIG2 is fetched into the region 4, a decreased amount of SIG4 in the region 2 is compensated upward (indicated by an arrow). The above-mentioned compensation is made by multiplying data input signal $D_{in}$ by plural types of coefficients, which are stored in the storage device 52 described referring to FIG. 2, at the multipliers 41 to 48.

Now, the method of preparation and method of utilization of coefficients 52 by which data input signal $D_{in}$ is multiplied at the multipliers 41 to 48 are described. First, in the document reading device 1, a black document is placed on a reading surface in the state of a document illumination lamp being turned on, and data thereof is fetched in. A read region of a signal from the above-mentioned reading device 1 is divided into n parts, and this signal will be n lines of signals, which are inputted to the mentioned signal-processing unit. Next, the document illumination lamp is turned on, and data obtained by reading a white document only in a read region of the first block having been divided and by reading a black document in the other blocks, are fetched. Subsequently, data obtained by reading a white document only in a read region of the second block and by reading a black document in the other blocks, are fetched. The same operation is done in the third block, the fourth block, . . . , and the nth block. Out of data having been fetched, first in the data of the white document having been read in the first block, comparison is made between data of each of the blocks other than the first block and data having been fetched with black documents in all regions. Herein, an input signal of a white document is processed as a large input at the maximum value of output bit numbers of the analog-digital conversion circuit 5, and an input signal of a black document is processed as a small input due to being a reference potential. A coefficient $C_{nx}$ is obtained by the following expression.

Coefficient $C_{nx}$={(black document data in the $n_{th}$ block)−(data in the $n_{th}$ block when a white document is read in the $x_{th}$ block)}/(black document data in the nth block)          [Expression 1]

As to this coefficient, n×(n−1) numbers of operations are made in the case where a document read line is divided into n blocks, and these coefficients are stored in a coefficient table of the storage device 52. These coefficients are stored in the storage device 52, and assigned in the multipliers 41 to 48 through the multiplexer 53 based on the number of the counter 10, whereby a document readout data $D_{out}$ to be output from the signal-processing unit becomes a data that is not affected by cross talk.

Figure 6:
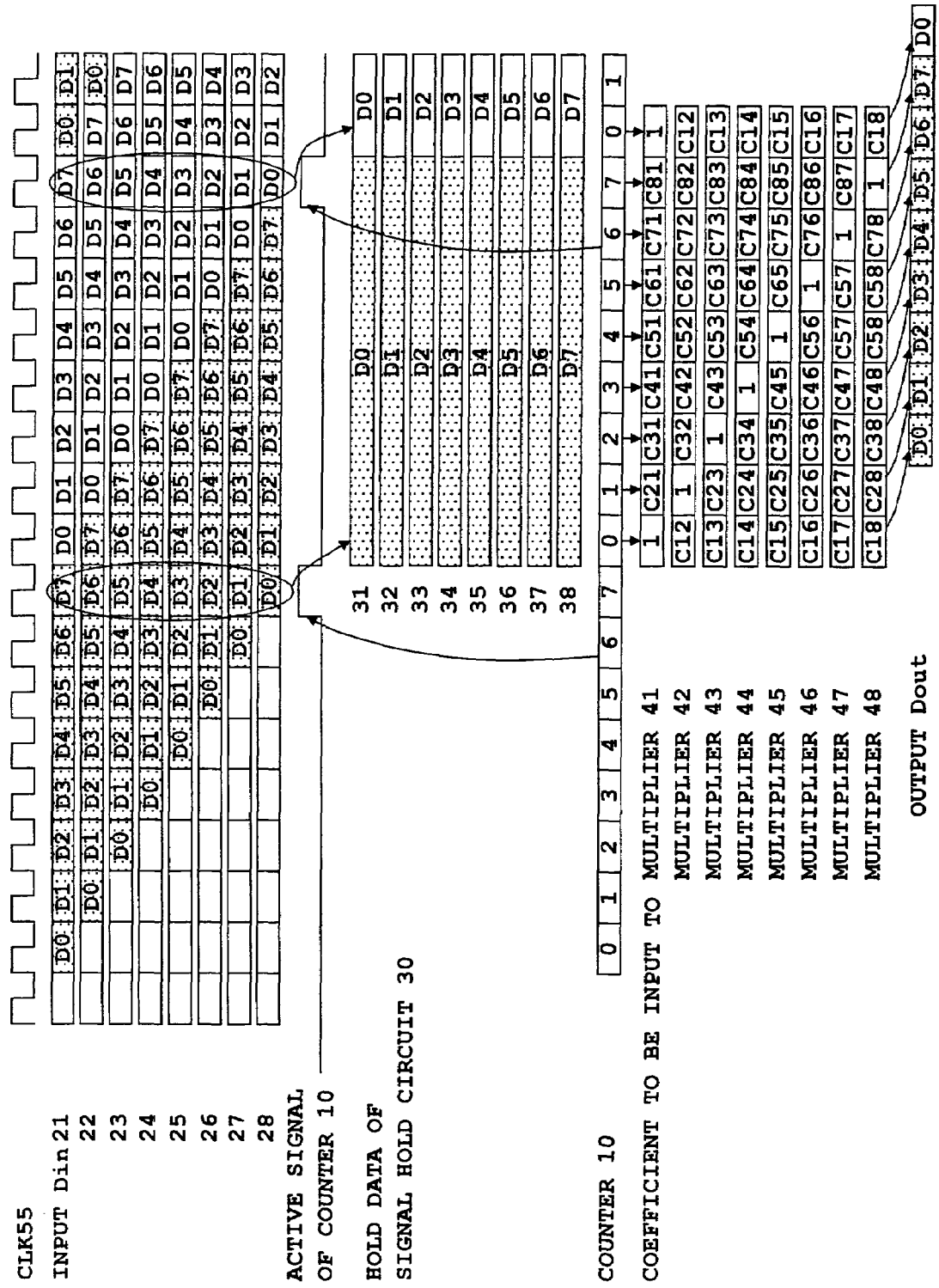
FIG. 6 is a timing chart schematically showing the flow of data processing of the signal-processing unit according to the first embodiment.

FIG. 6 is a timing chart schematically showing the flow of data processing of a signal-processing unit according to the invention. How to make the compensation actually using the coefficients obtained by the above-mentioned expression 1 is hereinafter described. A clock 55 is regularly inputted to a circuit according to the invention, and data $D_{in}$ are inputted to a shift register circuit 20 in synchronization with the rise or fall of the clock. Data in the block 21 at a certain time point is shifted to the block 22 at the next clock. Data in the block 22 is shifted to the block 23, data in the block 23 is shifted to the block 24, and thereafter data are shifted likewise between the blocks in sequence.

Furthermore, a counter 10 counts up in synchronization with the above-mentioned clock as well. Subsequently, at a time point of a counter coming to be "x" ("6" in the drawing), data D0 to D7 in the blocks 21 to 28 are fetched into data holding blocks 38 to 31 respectively, and held therein. The data having been fetched in the above-mentioned signal hold circuit 30 are multiplied by coefficients that are stored in the storage device (memory) 52 conforming to values of the counter. For example, in the case where a counter value is 0, coefficients C12 to C18 obtained by the calculation of expression 1 are used; and letting data having been in the block 31 D0, data having been in the block 32 D1, . . . , and data having been in the block 38 D7, D0', being a value of D0 after the compensation of cross talk, is obtained by the following calculation.

$D0'=D0 \times 1+D1 \times C12+D2 \times C13+D3 \times C14+D4 C15+D5 \times C16+D6 \times C17+D7 \times C18$ In the case where a counter value is 1, D1', being a value of D1 after the compensation of cross talk, is obtained by the following calculation.

$D1'=D0 \times C21+D1 \times 1+D2 \times C23+D3 \times C24+D4 \times C25+D5 \times C26+D6 \times C27+D7 \times C28$ Thereafter, every time clock is inputted, D2', . . . , D7' are obtained by the same calculation.

Thus, the first embodiment has such an advantage that each of a plurality of signals having been synchronously inputted to a signal-processing unit is multiplied by coefficients obtained by the calculation of effect levels between this signal and the other plural signals interfering with each other, thereby enabling to digitally solve cross talk, which occurs between the plurality of signals having been synchronously inputted to the signal-processing unit with reliability and high accuracy.

Additionally, with reference to FIG. 6, to compensate the cross talk between eight inputs, a counter is the one that counts 8, from 0 to 7, and digital data blocks are the one that prepares 8 blocks of blocks 21 to 28. However, in case where an object of which cross talk is compensated is different, it is a matter of course that numbers counted with a counter, the number of digital data blocks and the like are varied based on the difference in object.

Embodiment 2

Figure 7:
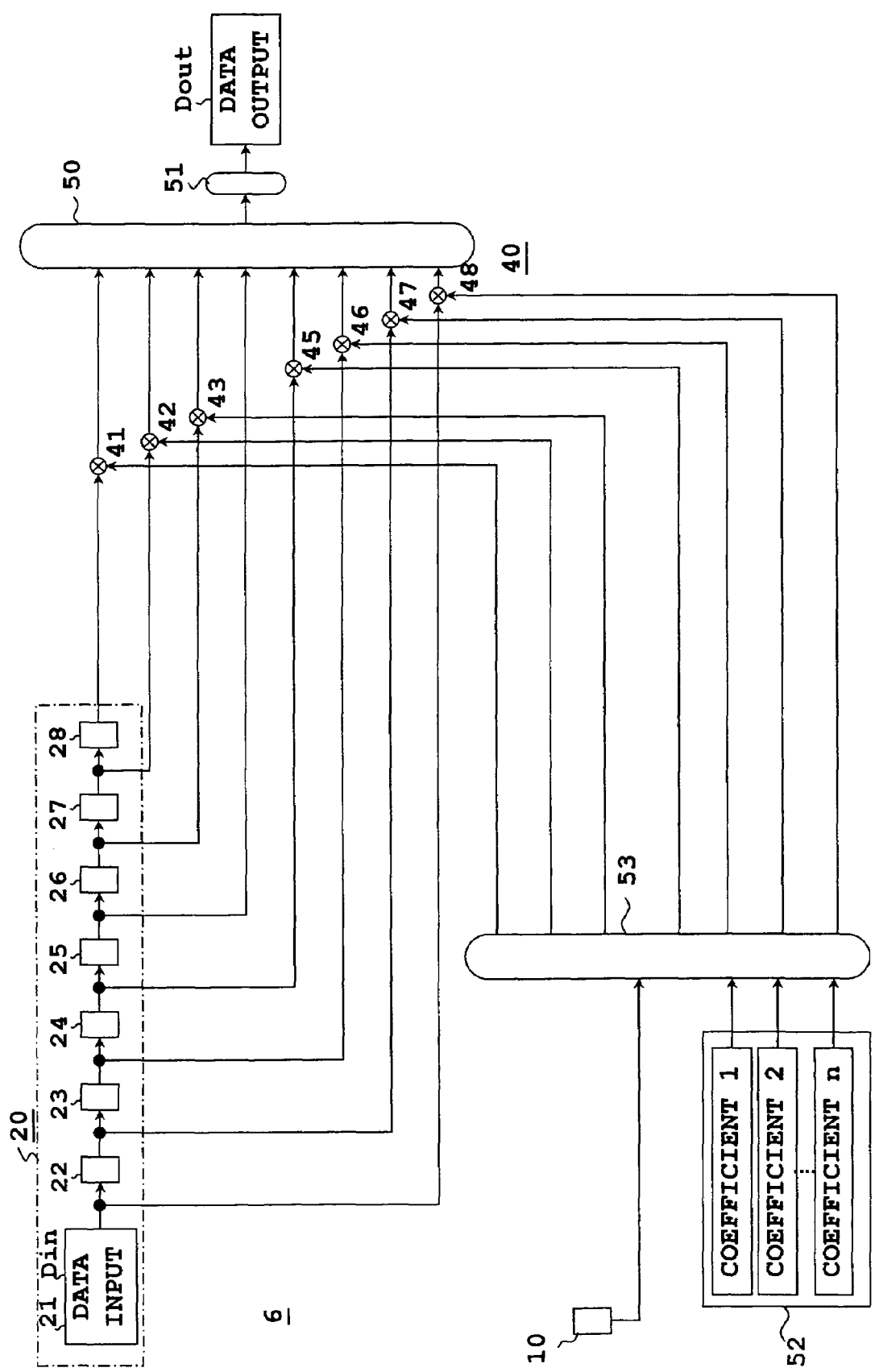
FIG. 7 is a circuit diagram showing a detailed arrangement of a cross talk compensation circuit of a signal-processing unit according to a second embodiment.
Figure 8:
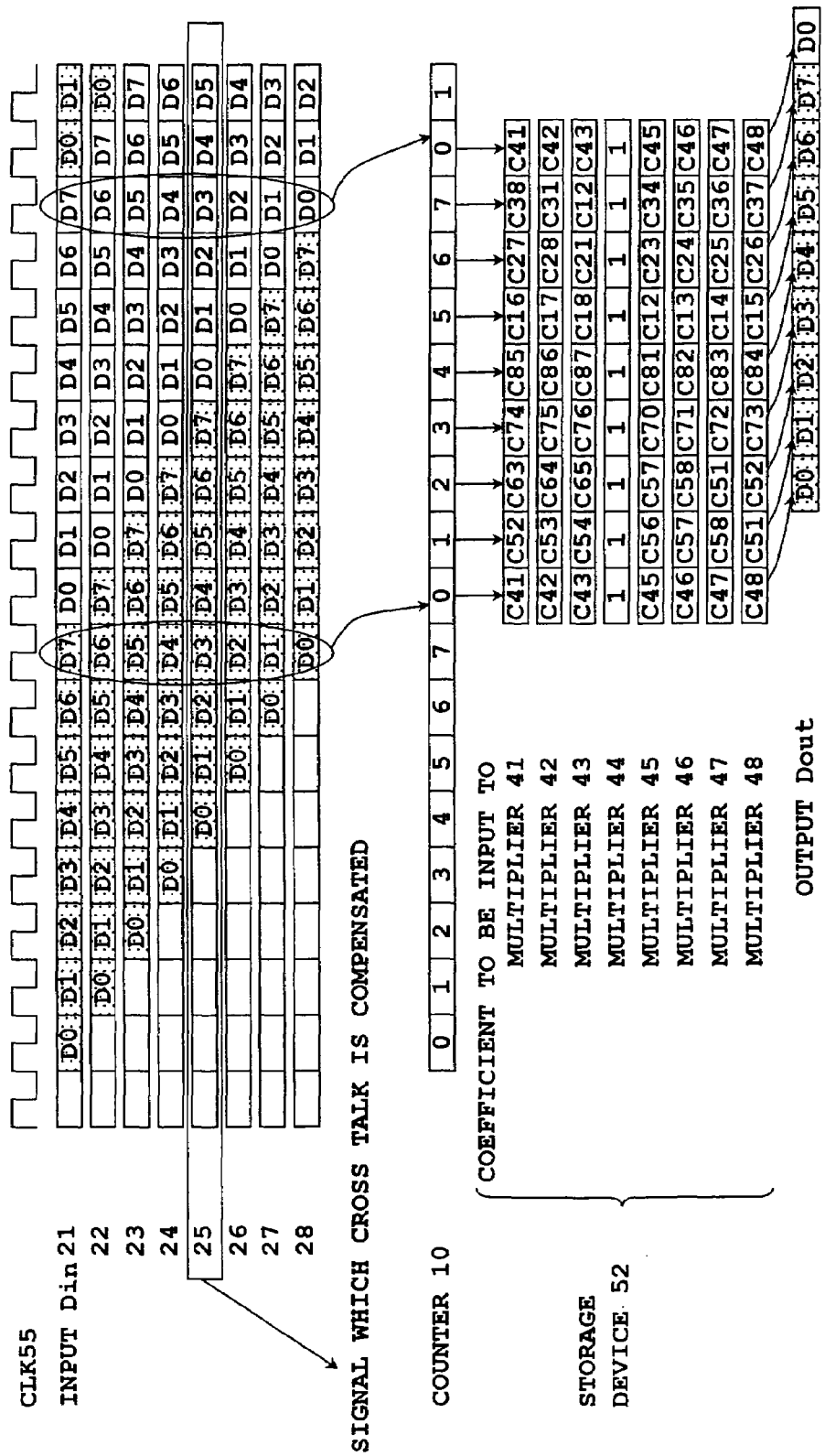
FIG. 8 is a timing chart schematically showing the flow of data processing of the signal-processing unit according to the second embodiment.

A second embodiment according to the invention is described referring to FIGS. 7 and 8. FIG. 7 is a schematic diagram of a cross talk compensation circuit of a signal-processing unit according to the second embodiment. FIG. 8 is a timing chart schematically showing the flow of data processing of the signal-processing unit according to the second embodiment. In the drawing, the same reference numerals indicate the same or like parts to those described in the first embodiment, and detailed description thereof is omitted.

In the above-mentioned cross talk compensation circuit according to the first embodiment, shown is an example in which each of a plurality of signals having been synchronously inputted to a signal-processing unit is multiplied by respective coefficients obtained by the calculation of effect levels between this signal and the other plural signals interfering with each other one-by-one. In a cross talk compensation circuit according to this second embodiment, shown is an example in which with respect to one signal out of signals having been sequentially outputted from the mentioned analog-digital conversion circuit, respective coefficients are obtained by the calculation of effect levels between signals before and after this signal and a plurality of signals interfering with each other.

In this example, it is assumed that the cross talk compensation is made with respect to data in a block 25 of a shift register 20.

Every time circuit-driving clocks rise or fall, data are shifted in the circuit from 21 to 22, 23, 24, 25, 26, 27 and 28. As to data in the block 25, the multiplication by a coefficient is not done, and the other seven data in the blocks 21, 22, 23, 24, 26, 27, 28 are multiplied by coefficient data to be outputted from a multiplexer circuit 53 using multipliers 48, 47, 46, 45, 43, 42, 41 respectively. These data are added up at an adder 50, thereby data of which cross talk has been compensated being outputted as $D_{out}$. Coefficients are obtained by the same calculation as that in the first embodiment. Now, how to make the compensation actually using coefficients obtained with the expression 1 based on a timing chart of FIG. 8 is described. 55 clocks are regularly inputted to a circuit according to the invention, and data are inputted in synchronization with the rise or fall of the clocks. Data in the block 21 at a certain time point is transferred to the block 22 at the next clock. Data in the block 22 is shifted to the block 23, data in the block 23 to the block 24, data in the block 24 to the block 25, data in the block 25 to the block 26, data in the block 26 to the block 27, and data in the block 27 to the block 28. Furthermore, a counter 10 counts up in synchronization with the clocks as well. The data of which cross talk is to be compensated is data that is stored in the block 25. Coefficients to be inputted to the multipliers 41 to 48 through a multiplexer 53 from a storage device 52 in which coefficient data are stored are varied as shown in FIG. 8 based on counter values. Thus, with respect to data having been stored in the block 25 at a certain time point, the multiplication by coefficients C41 to C43 of the preceding 3 clocks and by coefficients C45 to C48 of the subsequent 4 clocks is made, thereby enabling to compensate the cross talk affected by signals having been inputted in respective blocks.

As a result, according to the second embodiment, there is such an advantage that with respect to one signal, respective coefficients are obtained by the calculation of effect levels between the signals before and after the one signal and a plurality of signals interfering with each other, thereby enabling to solve cross talk that occurs between a plurality of signals synchronously inputted to a signal-processing unit with a simple digital circuit.

Embodiment 3

A third embodiment according to the invention is described referring to FIG. 1. The third embodiment provides a signal-processing unit to which a communication processing circuit 8 that alters, from outside the storage device 52, cross talk elimination coefficients stored in the storage device 52 according to the first embodiment or the second embodiment, is added. The use of this communication processing circuit 8 makes it possible to externally rewrite sequentially the coefficients of the storage device 52.

The communication processing circuit 8 comprises a part that receives inputs from outside, a part that causes data having been received to be synchronous with clocks driving a cross talk compensation circuit 6 and a signal-processing circuit 7, a part that converts data to those in format of the cross talk compensation circuit 6 capable of interpreting as needed, and a part that transmits inputs to a storage device 52 of the cross talk compensation circuit 6 (not shown in the drawing.) The above-mentioned part of receiving inputs may be a serial signal line consisting of four independent lines of an input signal line, an output signal line, a clock signal line, and a signal active/reactive indication signal line, or a parallel signal line that transmits input/output signals as parallel signal of an appropriate number of bits. In addition, a serial signal line is characterized in lower transmission speed, but a small number of lines; while a parallel signal line is characterized in a larger number of lines due to the increase of signal lines for input/output, but higher transmission speed. It is preferable to select an input receiving part based on applications from time to time.

The invention claimed is:

1. A signal-processing unit, comprising:
   an input unit configured to provide a plurality of analog input signals;
   a multiplexer circuit that receives said plurality of analog signals from said input unit and outputs the plurality of analog signals to one signal line in a desired sequence;
   an analog-digital conversion circuit that sequentially converts each analog signal output from the multiplexer circuit into a digital signal and outputs the digital signal; and
   a cross talk compensation circuit configured (1) to receive a plurality of the digital signals sequentially outputted from said analog-digital conversion circuit, (2) to assign, for each digital signal of the plurality of digital signals, a corresponding set of coefficients selected so as to compensate for interference effect levels between the plurality of analog input signals and (3) to calculate, for each digital signal of the plurality of digital signals, an output value by multiplying the plurality of digital signals by said corresponding set of coefficients and summing the multiplied signals.

2. The signal-processing unit according to claim 1, wherein the cross talk compensation circuit comprises:

a counter that counts a number of the plurality of digital signals;
a shift register having a plurality of storage blocks, the shift register configured to store said plurality of digital signals and to shift said plurality of digital signals to subsequent storage blocks based on a clock period;
a signal hold circuit configured to hold said plurality of digital signals until a second plurality of digital signals are stored in said plurality of storage blocks;
a multiplier configured to multiply each digital signal of the plurality of digital signals held in said signal hold circuit by a coefficient of said set of coefficients obtained by calculating a said signal interference effect levels between the plurality of analog input signals; and
an adder configured to sum the multiplied digital signals and to output the sum as the output value for which the interference effect level has been compensated.

3. The signal-processing unit according to claim 1, further comprising a communication processing circuit configured to alter said set of coefficients stored in said cross talk compensation circuit according to input from outside the communication processing circuit.

4. A signal-processing unit, comprising:
   an input unit configured to provide a plurality of analog input signals;
   a multiplexer circuit that receives said plurality of analog signals from said input unit and outputs the plurality of analog signals into one signal line in a desired sequence;
   an analog-digital conversion circuit that sequentially converts each analog signal output from the multiplexer circuit into a digital signal and outputs the digital signal; and
   a cross talk compensation circuit configured (1) to receive a digital signal out of the plurality of digital signals sequentially outputted from said analog-digital conversion circuit, (2) to assign, for said digital signal, a corresponding set of coefficients selected to compensate for interference effect levels between the analog input signal corresponding to the digital signal and the plurality of analog input signals received before and after said analog input signal, and (3) to obtain output data by multiplying the plurality of digital signals by said corresponding set of coefficients and summing the multiplied signals.

5. The signal-processing unit according to claim 4, wherein the cross talk compensation circuit comprises:
   a counter that counts a number of the plurality of digital signals;
   a shift register having a plurality of storage blocks, the shift register configured to store said plurality of digital signals and to shift said plurality of digital signals to subsequent storage blocks based on a clock period;
   a multiplier configured to multiply the digital signal of said plurality of digital signals held in each of said plurality of storage blocks by a coefficient of said set of coefficients obtained by calculating said signal interference effect levels between the plurality of analog input signals; and
   an adder configured to sum the multiplied signals and to output the sum as the output data for which the interference effect level has been compensated.

6. The signal-processing unit according to claim 4, further comprising a communication processing circuit configured to alter said set of coefficients stored in said cross talk compensation circuit according to input from outside the communication processing circuit.

* * * * *